(12) United States Patent
Yang

(10) Patent No.: US 9,369,113 B2
(45) Date of Patent: Jun. 14, 2016

(54) IMPEDANCE ADJUSTING DEVICE

(71) Applicant: Steve Yang, New Taipei (TW)

(72) Inventor: Steve Yang, New Taipei (TW)

( * ) Notice: Subject to any disclaimer, the term of this patent is extended or adjusted under 35 U.S.C. 154(b) by 27 days.

(21) Appl. No.: 14/309,971

(22) Filed: Jun. 20, 2014

(65) Prior Publication Data
US 2015/0372663 A1 Dec. 24, 2015

(51) Int. Cl.
*H03L 5/00* (2006.01)
*H03H 11/28* (2006.01)

(52) U.S. Cl.
CPC ..................... *H03H 11/28* (2013.01)

(58) Field of Classification Search
CPC .................. H03K 11/04222; H03K 11/04
USPC .................. 327/308, 551–559; 333/81 R
See application file for complete search history.

(56) References Cited

U.S. PATENT DOCUMENTS

| | | | | | |
|---|---|---|---|---|---|
| 5,457,622 | A * | 10/1995 | Arakawa | ................. | H02M 1/36 323/222 |
| 7,038,437 | B2 * | 5/2006 | Kenny | ................. | H02M 3/157 323/283 |
| 7,804,196 | B2 * | 9/2010 | Watanabe | ............. | H02M 3/158 307/10.1 |
| 7,821,801 | B2 * | 10/2010 | Janson | ................ | H02M 1/4241 323/208 |
| 8,184,421 | B2 * | 5/2012 | Watanabe | ............. | H02M 3/158 361/101 |

* cited by examiner

*Primary Examiner* — Dinh T Le
(74) *Attorney, Agent, or Firm* — Alan D. Kamrath; Kamrath IP Lawfirm, P.A.

(57) ABSTRACT

An impedance adjusting device includes a power output port, a ground terminal, a capacitor assembly including at least one capacitor, and a power output port. The power input port is electronically connected to a switching power supply, and the capacitor is electronically connected between the power input port and the ground terminal. The capacitor is connected in parallel to an output capacitor of the switching power supply to regulate a flat impedance of the switching power supply when an audio signal is played at full 20 Hz to 20 KHz frequencies at the same output audio voltage level.

15 Claims, 13 Drawing Sheets

IMPEDANCE ADJUSTING DEVICE

BACKGROUND OF THE INVENTION

1. Field of the Invention

The present invention relates to an impedance adjusting device and, particularly, to a power impedance adjusting device that adjusts impedance of a switching power supply for an electronic device to play audio signals without distortions.

2. Description of the Related Art

In an ideal condition, an impedance of a capacitor decreases as an operating frequency of the capacitor increases. But actually, the capacitor has a capacitance and a parasitic inductance. Therefore, the impedance of the capacitor includes both the capacitive impedance and inductive impedance. When the input frequency equals an impedance related with frequency of the capacitor, the capacitor has the smallest impedance. Namely, when the input frequency is larger than the impedance related with frequency, the impedance of the capacitor increases as the input frequency increases because of the parasitic inductance, and when the input frequency is smaller than the impedance related with frequency, the impedance of the capacitor decreases as the input frequency increases because of the capacitance.

With reference to FIG. 9 and FIG. 10, when the input frequency increases gradually, the impedance of the capacitor decreases first and then increases. Each capacitor has a particular impedance related with frequency, and when the input frequency equals the impedance related with frequency of the capacitor, the capacitor has the smallest impedance.

With reference to FIG. 11, an electronic device 60 receives electric power from a switching power supply 50, and can output audio signals whose frequencies are in an audible range, such as between 20 Hz and 20000 Hz. The electronic device 60 has a digital to analog converter 61 to output the audio signals and an amplifier 62 to amplify the audio signals. The digital to analog converter 60 is electrically connected to the amplifier 62 to output the audio signals to the amplifier 62, and is electrically connected to the switching power supply 50 to receive electric power from the switching power supply 50. The amplifier 62 amplifies the audio signals, and outputs the amplified audio signals to an external audio device 70 for playing the amplified audio signals at larger volume. When the external audio device 70 plays the amplified audio signals, a current will go through the switching power supply 50, the amplifier 62, and the external audio device 70. Therefore, an impedance of a capacitor C mounted in the switching power supply 50 connected to the electronic device 60 is influenced by frequencies of the audio signals. Since an output impedance of the switching power supply 50 corresponds to the impedance of the capacitor C and a gain of the amplifier corresponds to the impedance of the output capacitor C, the gain of the amplifier is influenced according to variation of the impedance of the capacitor C. The capacitor C acts as an AC filter in a DC mode and an impedance in an audio signal mode. The capacitor C, made by the roll aluminum foil type, will contain an inductance effect to the audio signal mode. The impedance of the capacitor C to the audio frequency will be $$R = \frac{1}{2\pi fc} + 2\pi fL$$

as FIG. 9. The related audio signal output voltage to the external audio device will be as FIG. 10. The frequency of the audio signal output voltage is not a flat response, that can not perform a full spectrum of 20 Hz to 20 KHz of the audio signal and needs to be solved.

SUMMARY OF THE INVENTION

An objective of the present invention is to provide an impedance adjusting device to solve the distortion problem of amplified audio signals.

To achieve the foregoing objective, the impedance adjusting device is electronically connected between a switching power supply and an electronic device having an amplifier, and comprises a power input port, a ground terminal, a capacitor assembly including at least one capacitor, and a power output port. The capacitor has a first common terminal and a second common terminal. The first common terminal is electronically connected to the power input port, and the second common terminal is electronically connected to the ground terminal. The power output port is electronically connected to the first common terminal.

The capacitor has an impedance related with frequency, and is adapted to adjust an impedance of the switching power supply to regulate the impedance of the switching power supply.

The impedance adjusting device in accordance with the present invention is mounted on a power output of the switching power supply, and the impedance related with frequency of the capacitor is different from an output capacitor of the switching power supply. The capacitor is electronically connected between the power input port and the ground terminal. Namely, the capacitor is connected in parallel to the output capacitor of the switching power supply to adjust the impedance of the switching power supply at different frequencies of audio signals for increasing bandwidth of amplified audio signals to provide a more flat impedance in total at audio frequency applications. A total impedance of the output capacitor and the capacitor(s), which are connected in parallel, is a different specification from the output capacitor and the capacitor(s). Therefore, the capacitor(s) can adjust the total impedance of the power supply to be flat as FIG. 3 than the prior art of impedance in frequency as FIG. 9. The output of audio voltage in frequency to the external audio device will be as FIG. 10.

Other objectives, advantages and novel features of the invention will become more apparent from the following detailed description when taken in conjunction with the accompanying drawings.

DETAILED DESCRIPTION OF THE INVENTION

Figure 1A:
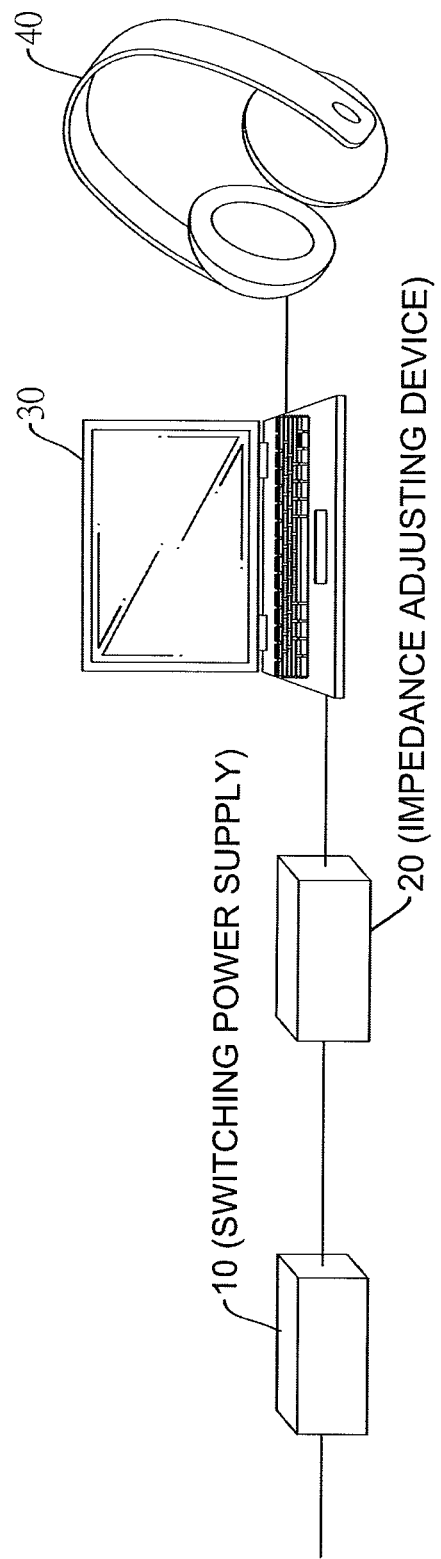
FIG. 1A is a schematic view of a first embodiment of the present invention adapted to a switching power supply.
Figure 1B:
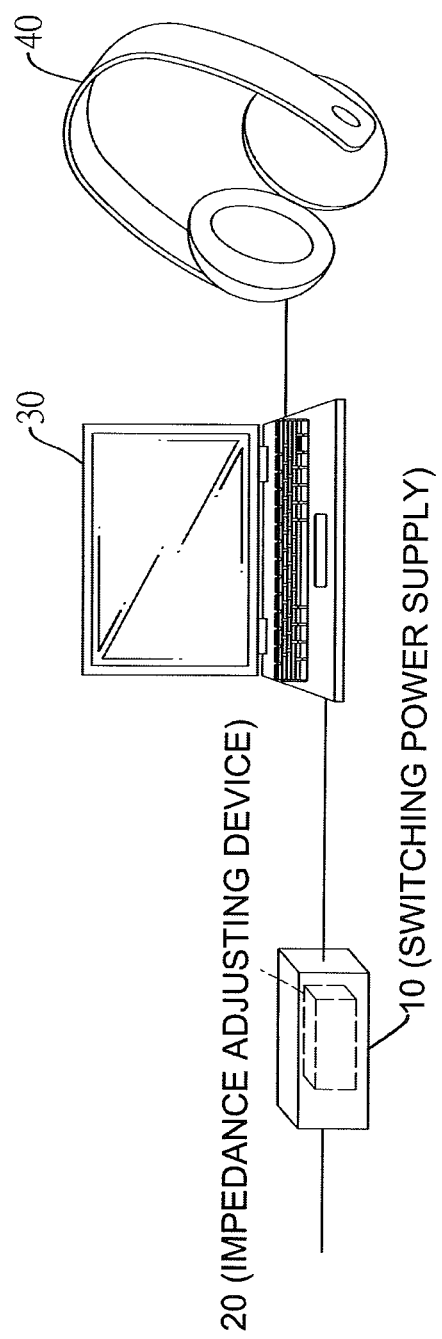
FIG. 1B is a schematic view of the first embodiment of the present invention mounted in a switching power supply.
Figure 2A:
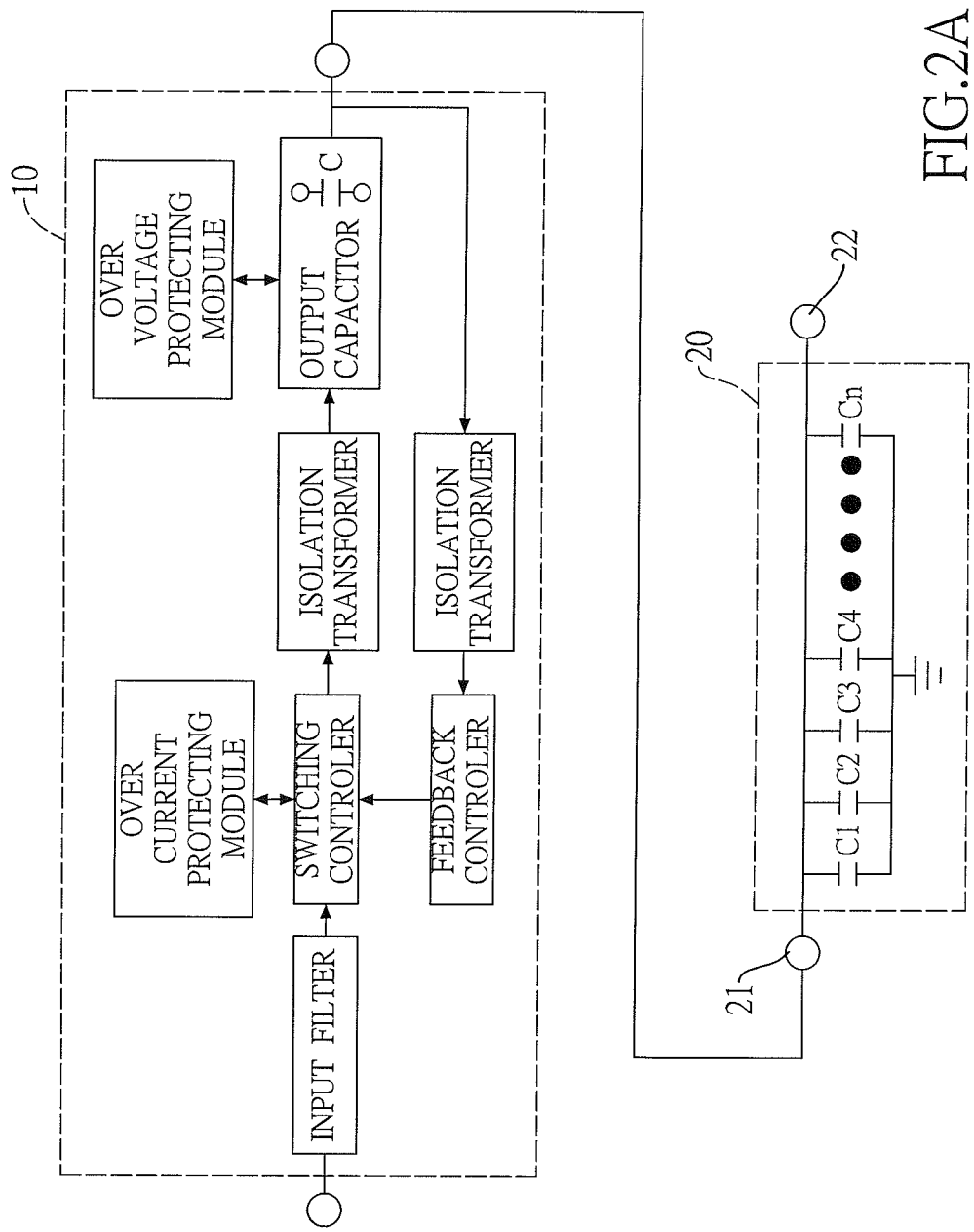
FIG. 2A is a block diagram of the first embodiment of the present invention of FIG. 1A.
Figure 2B:
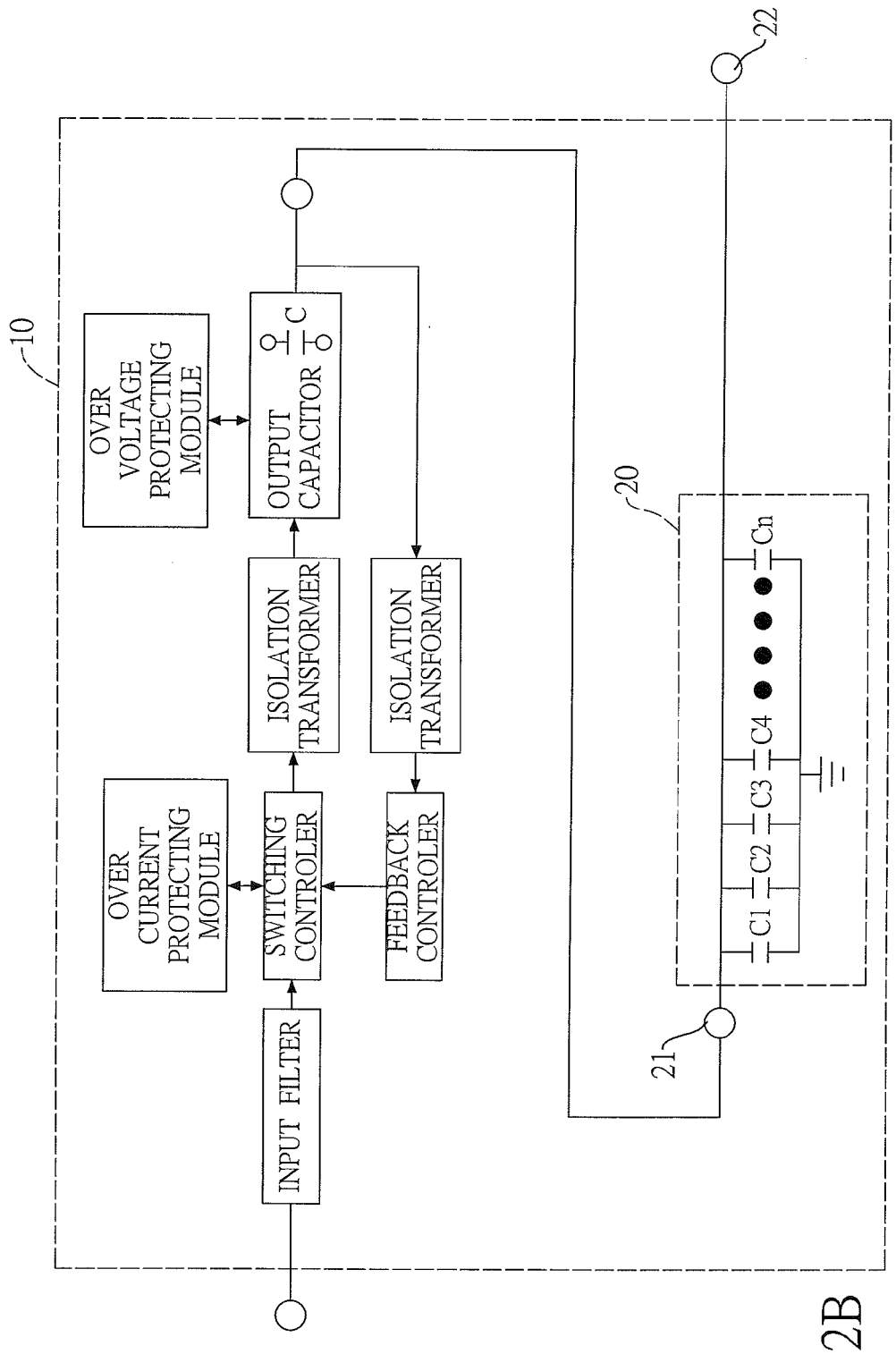
FIG. 2B is a block diagram of the first embodiment of the present invention of FIG. 1B.

With references to FIGS. 1A, 1B, 2A, and 2B, an impedance adjusting device 20 in accordance with the present invention is electronically connected between a switching power supply 10 and an electronic device 30 having an amplifier. The impedance adjusting device 20 comprises a power input port 21, a ground terminal, a capacitor assembly including at least one capacitor, and a power output port 22. FIGS. 1B and 2B mean the present invention is integrated inside the switching power supply.

In the embodiments, the capacitor assembly of the impedance adjusting device 20 comprises a plurality of capacitors C1 to Cn. The capacitors C1 to Cn are connected in parallel, and each of the capacitors C1 to Cn separately has a first common terminal and a second common terminal. The first common terminals of the capacitors C1 to Cn are electronically connected to the power input port 21, and the second common terminals of the capacitors C1 to Cn are electronically connected to the ground terminal.

The power output port 22 is electronically connected to the first common terminals of the capacitors C1 to Cn. Each of the capacitors C1 to Cn has an impedance related with frequency, and the impedance related with frequencies of the capacitors C1 to Cn are different from each other. The switching power supply 10 comprises an output capacitor C having an impedance related with frequency, the impedance related with frequency of the output capacitor C is different from the impedances related with frequency of the capacitors C1 to Cn.

The electronic device 30 can output audio signals, such as music or a movie, the electronic device 30 may be electronically connected to a playing device 40, and a user can listen to the audio signals through the playing device 40. In the first embodiment, the playing device 40 is a headphone set. The electronic device 30 comprises the amplifier (not shown in figure). When the frequency of the audio signal approaches the impedance related with frequency of the output capacitor C, an impedance of the output capacitor C is at a smallest value.

Figure 3:
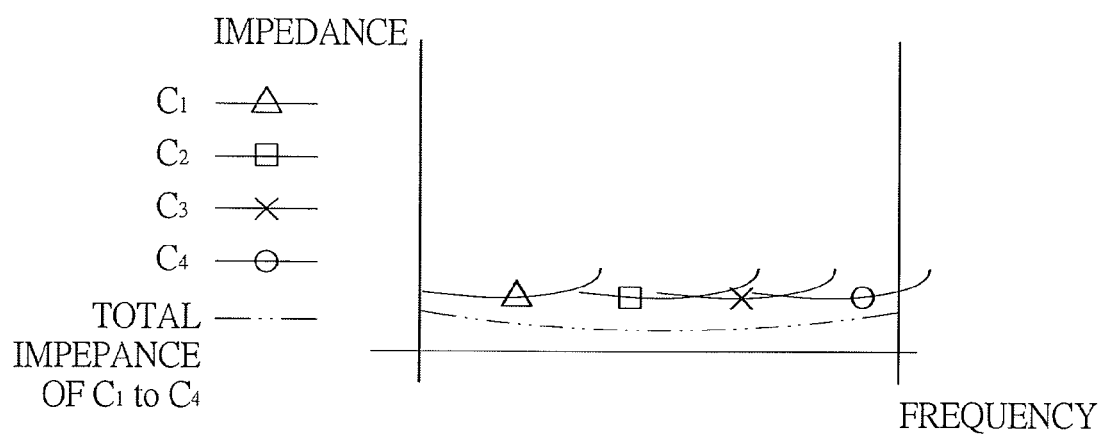
FIG. 3 is a curve diagram of impedances and frequencies of capacitors.
Figure 4:
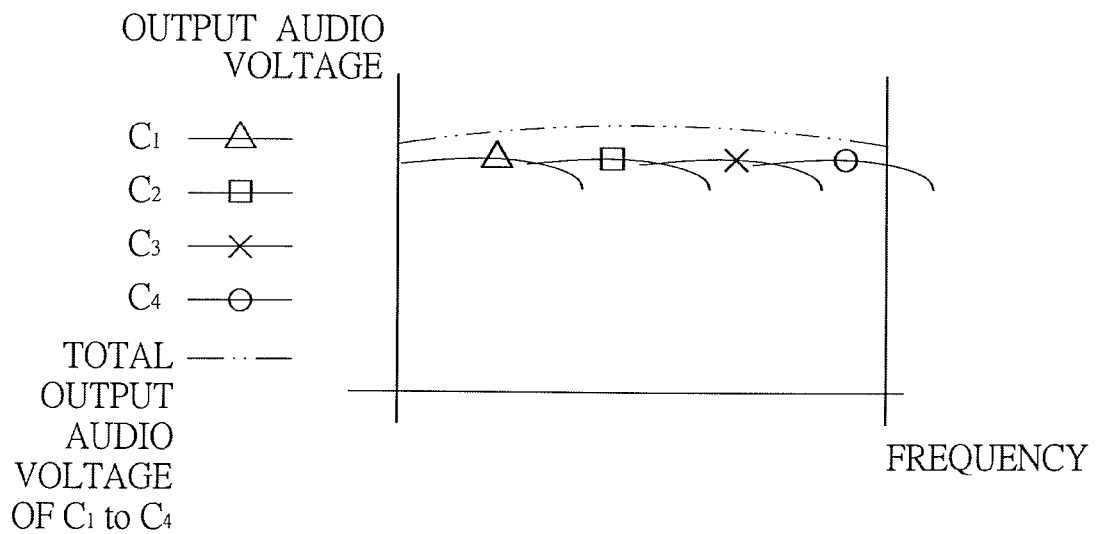
FIG. 4 is a curve diagram of voltages and frequencies of capacitors.

With references to FIGS. 3 and 4, when the frequency of the audio signal is distant from the impedance related with frequency of the output capacitor C, the frequency of the audio signal may approach the related with frequency of one of the capacitors C1 to Cn of the switching power supply 10. Since the capacitors C1 to Cn and the output capacitor C are connected in parallel, a total impedance of the output capacitor C and the capacitor assembly will regulate a much more flat impedance of the capacitor C1 to Cn. Namely, when the impedance adjusting device 20 is electronically connected between the switching power supply 10 and the electronic device 30, variation of an output impedance of the switching power supply 10 caused by the output capacitor C can be regulated more flat, and the variation of the output impedance of the switching power supply 10 is smaller than the impedance of any one of the capacitors C1 to Cn. The impedance adjusting device 20 can reduce influence caused by the output capacitor C, and the output impedance of the switching power supply 10 is regulated as flat, and the frequency of the audio signals of output will perform a full spectrum of 20 Hz to 20 KHz to the external audio device.

In other words, when the impedance of the output capacitor C increases as the frequency of the audio signals increases, the variation of the output impedance of the switching power supply 10 can be reduced. The impedance of the switching power supply 10 is stabilized, and a gain of the amplifier of the electronic device 30 is stabilized to increase a bandwidth in which the amplified audio signals have no distortion. In the embodiment, the frequencies of the audio signals are in an audible range from 20 Hz to 20000 Hz.

In the embodiment, the capacitances of the capacitors C1 to Cn are decided by the following. An attenuation value (db) of a load and a smallest value of the frequency ($f_s$) of the audio signals are predetermined. An impedance of the load ($R_{load}$), an input current ($I_{in}$), and an output current ($I_{out}$) are measured. Then, a capacitance of the first capacitor C1 (c) is determined by the following formula. In the embodiment, the smallest value of the frequency ($f_s$) of the audio signals is 20 Hz.

$$db = 10 \times \log\left(\frac{I_{out}^2 \times R_{load}}{I_{in}^2 \times \left(R_{load} + \frac{1}{2\pi f_s c}\right)}\right)$$

When the capacitance of the first capacitor C1 (c) is calculated, a user selects a commercially available capacitor with a capacitance approaching the calculated capacitance as the capacitor C1. Then, the capacitance of the second capacitor C2 is determined by dividing the capacitance of the first capacitor C1 by a fixed number, such as 10. For example, $$C2 = \frac{C1}{10}.$$

The capacitances of the remaining capacitors C3 and C4 to Cn are determined by a same method, $$C_n = \frac{C_{n-1}}{10}.$$

Namely, the capacitance of a next capacitor ($C_{next}$) is determined by dividing the capacitance of a previous capacitor ($C_{previous}$) by the fixed number (N), $$C_{next} = \frac{C_{previous}}{N}.$$

The capacitance of the capacitor Cn is determined until the capacitance of the capacitor Cn approaches a predetermined lowest capacitance. If any one of the capacitances of the capacitors C1 to Cn equals the capacitance of the output capacitor C, the capacitor having a same capacitance of the output capacitor C is not selected. Namely, any one of the capacitances of the capacitors C1 to Cn is not equal to the capacitance of the output capacitor. The predetermined smallest capacitance is determined by the same formula for calculating the capacitance of the capacitor C1, wherein the smallest value of the frequency ($f_s$) is replaced by the largest value of the frequency ($f_l$) of the audio signals. In the embodiment, the largest value of the frequency ($f_l$) of the audio signals is 20000 Hz.

$$db = 10 \times \log\left(\frac{I_{out}^2 \times R_{load}}{I_{in}^2 \times \left(R_{load} + \frac{1}{2\pi f_l c}\right)}\right)$$

Therefore, the more the amount of the capacitors C1 to Cn is determined. Namely, when the frequency of the audio signal is distant from the impedance related with frequency of the capacitor C1, the frequency of the audio signal may quickly approach the impedance related with frequency of the other capacitor C2. Variation of the impedance of the switching power supply 10 between the smallest value of the frequency ($f_s$) of the audio signal and the largest value of the frequency ($f_l$) of the impedance of switching power supply is flat, and the user can listen to the audio signal with the flat frequency response of the full spectrum from 20 Hz to 20 KHz.

For example, the impedance adjusting device 20 in accordance with the present invention is adapted to a personal computer or a notebook computer. With references FIGS. 1A and 1B, the impedance adjusting device 20 is electronically connected between the switching power supply 10 and the notebook computer. When the impedance adjusting device 20 is adapted to the personal computer, the impedance adjusting device 20 is mounted in the personal computer and has 12V and 5V connectors. The 12V and 5V connectors connect to units of the personal computer to provide electric power. The impedance adjusting device 20 is electronically connected with a switching power supply of the personal computer in parallel with the output capacitor of the switching power supply. Besides, the impedance adjusting device 20 is electronically connected with the switching power supply 10, and may be mounted in or out of the switching power supply 10. Namely, the switching power supply 10 may or may not comprise the impedance adjusting device 20.

Figure 5:
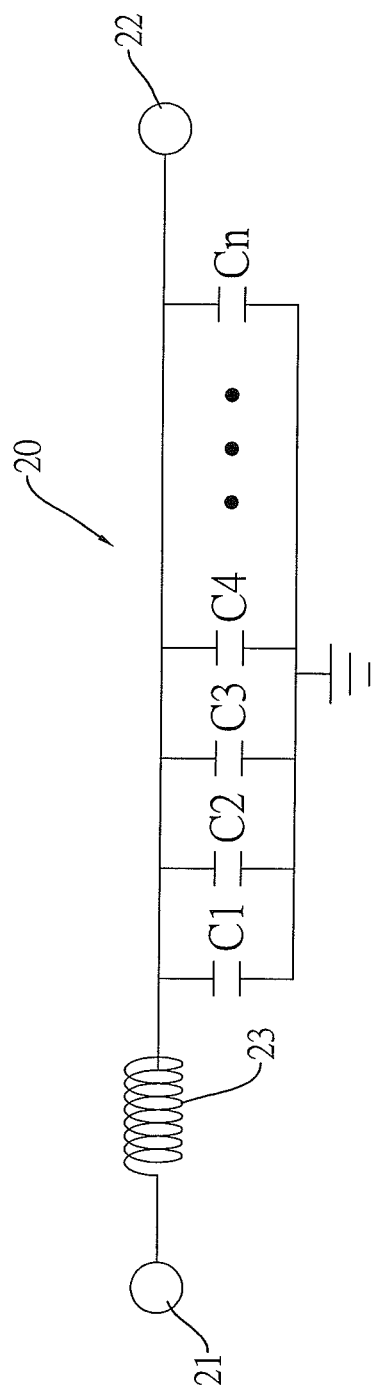
FIG. 5 is a circuit diagram of a second embodiment of the present invention.

With reference to FIG. 5, compared with the first embodiment of the impedance adjusting device 20 in accordance with the present invention, a second embodiment further comprises an inductor 23. The inductor 23 is electronically connected between the power input port 21 and the power output port 22 to perform a CLC filter for filtering noises.

Figure 6:
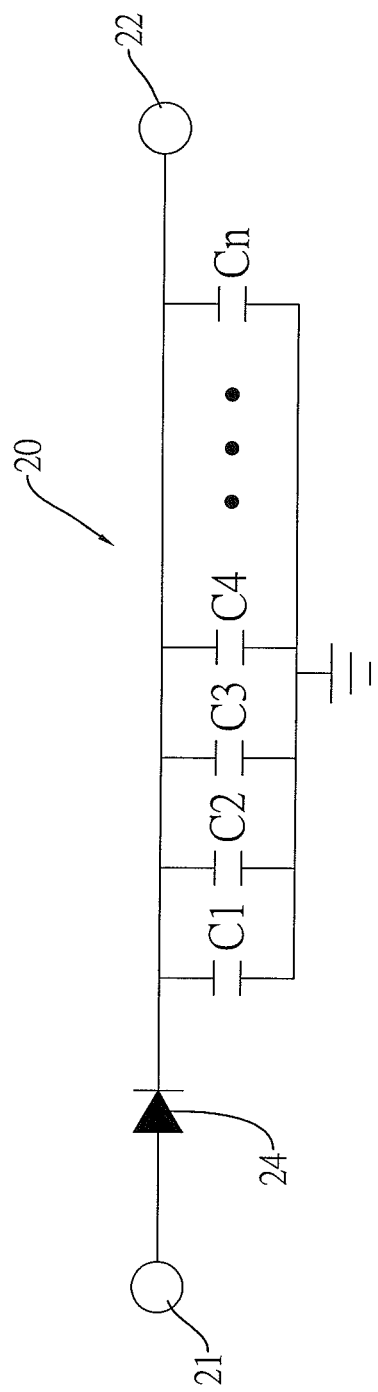
FIG. 6 is a circuit diagram of a third embodiment of the present invention.

With reference to FIG. 6, compared with the first embodiment of the impedance adjusting device 20 in accordance with the present invention, a third embodiment further comprises at least one diode 24. An anode of the diode 24 is electronically connected with the power input port 21, and a cathode of the diode 24 is electronically connected with the power output port 22. The diode 24 can decrease a voltage between the first common terminals and the second common terminals of the capacitors C1 to Cn to protect the capacitors C1 to Cn from overvoltage.

Figure 7:
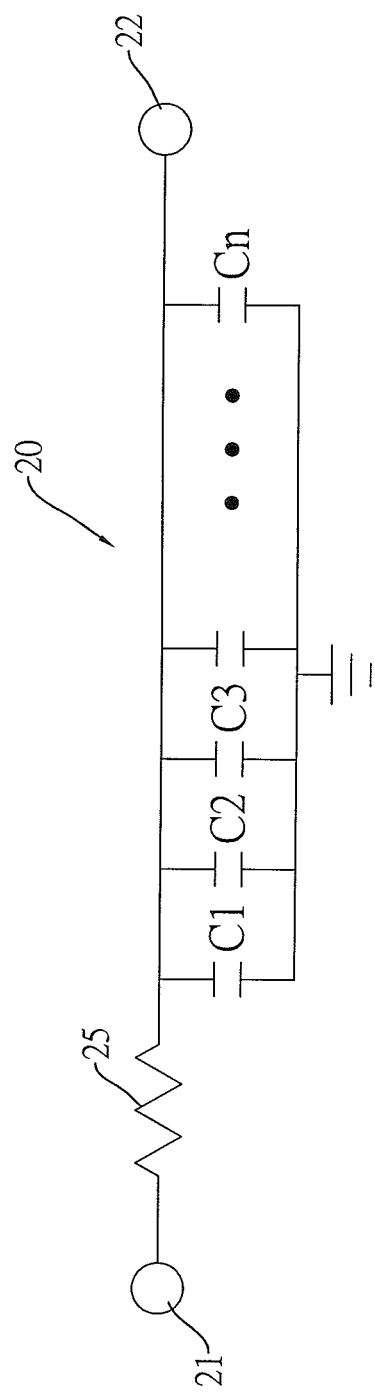
FIG. 7 is circuit diagram of a fourth embodiment of the present invention.

With reference to FIG. 7, compared with the first embodiment of the impedance adjusting device 20 in accordance with the present invention, a fourth embodiment further comprises a first resistor 25. The first resistor 25 is electronically connected between the power input port 21 and the power output port 22 to perform a CRC filter for filtering noises.

Figure 8:
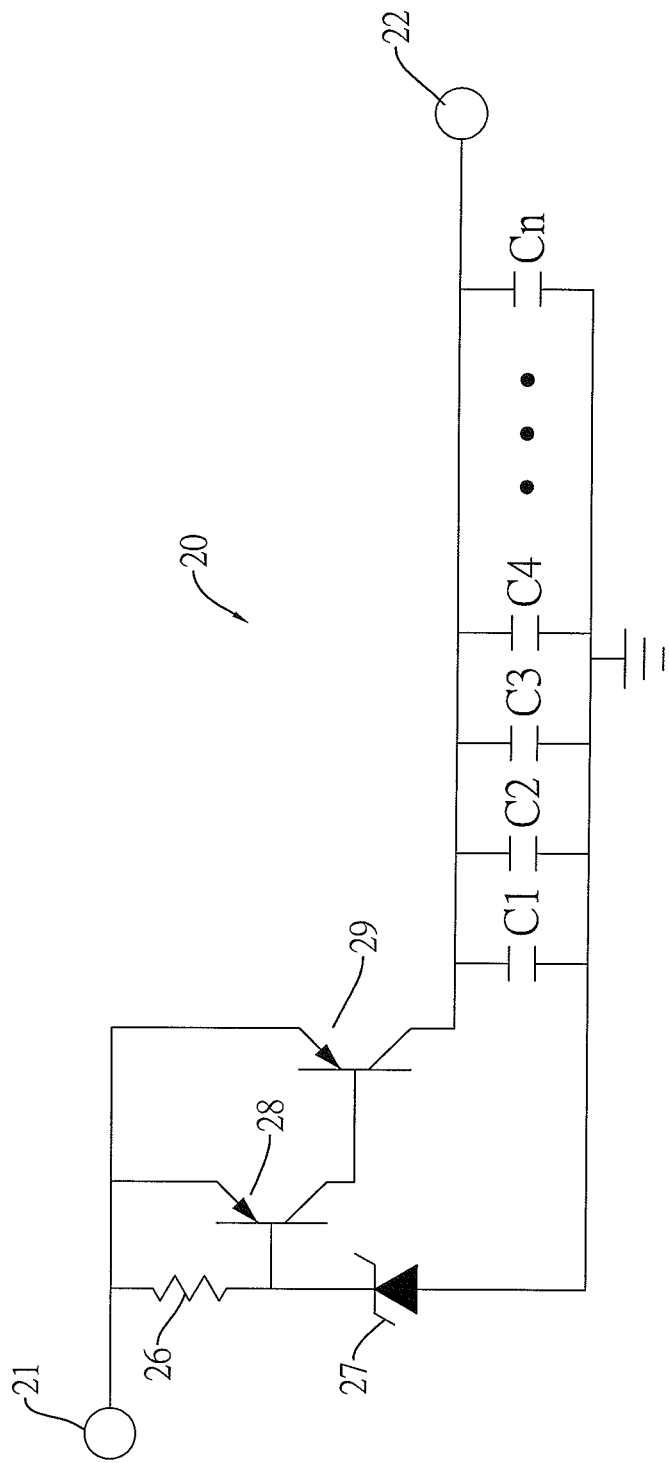
FIG. 8 is circuit diagram of a fifth embodiment of the present invention.
Figure 9:
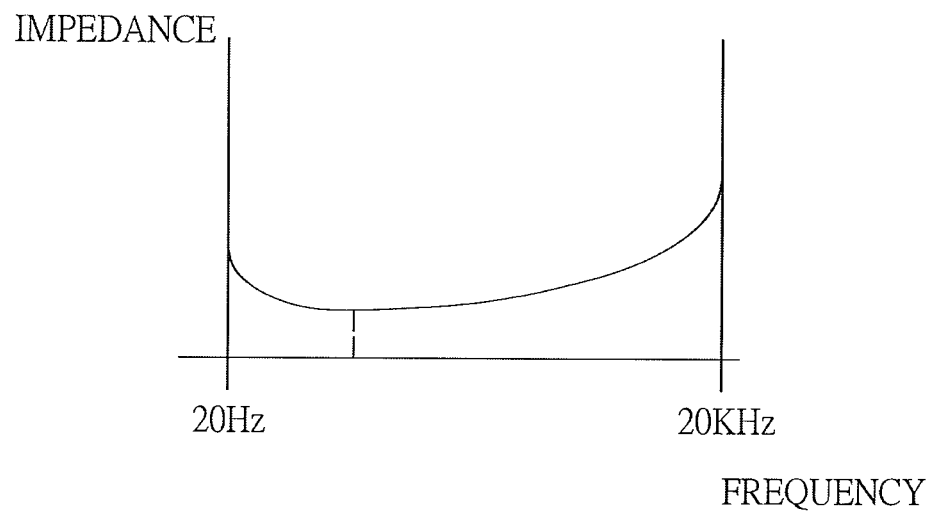
FIG. 9 is a curve diagram of impedances and frequencies of an output capacitor of a switching power supply of the prior art.
Figure 10:
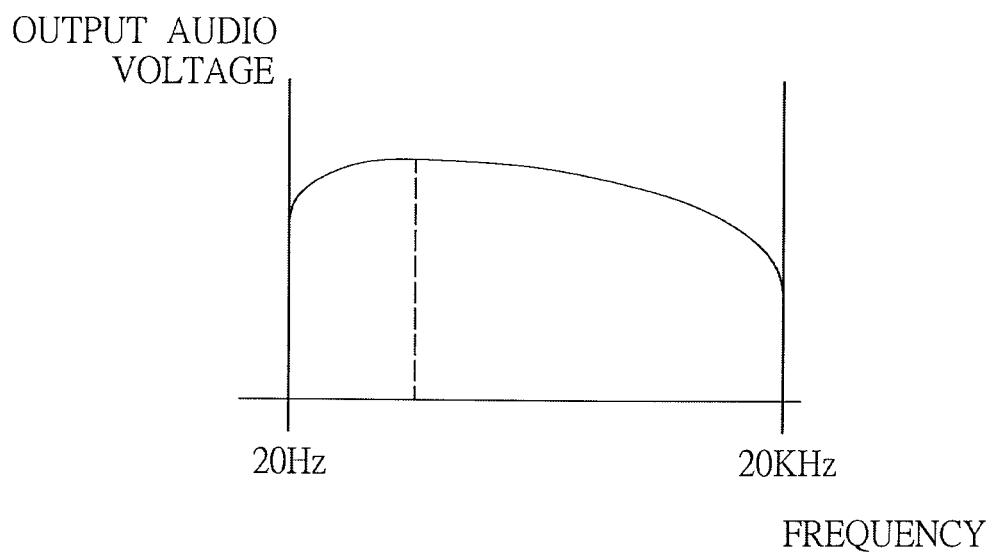
FIG. 10 is a curve diagram of audio voltages and frequencies of an output capacitor of a switching power supply of the prior art.
Figure 11:
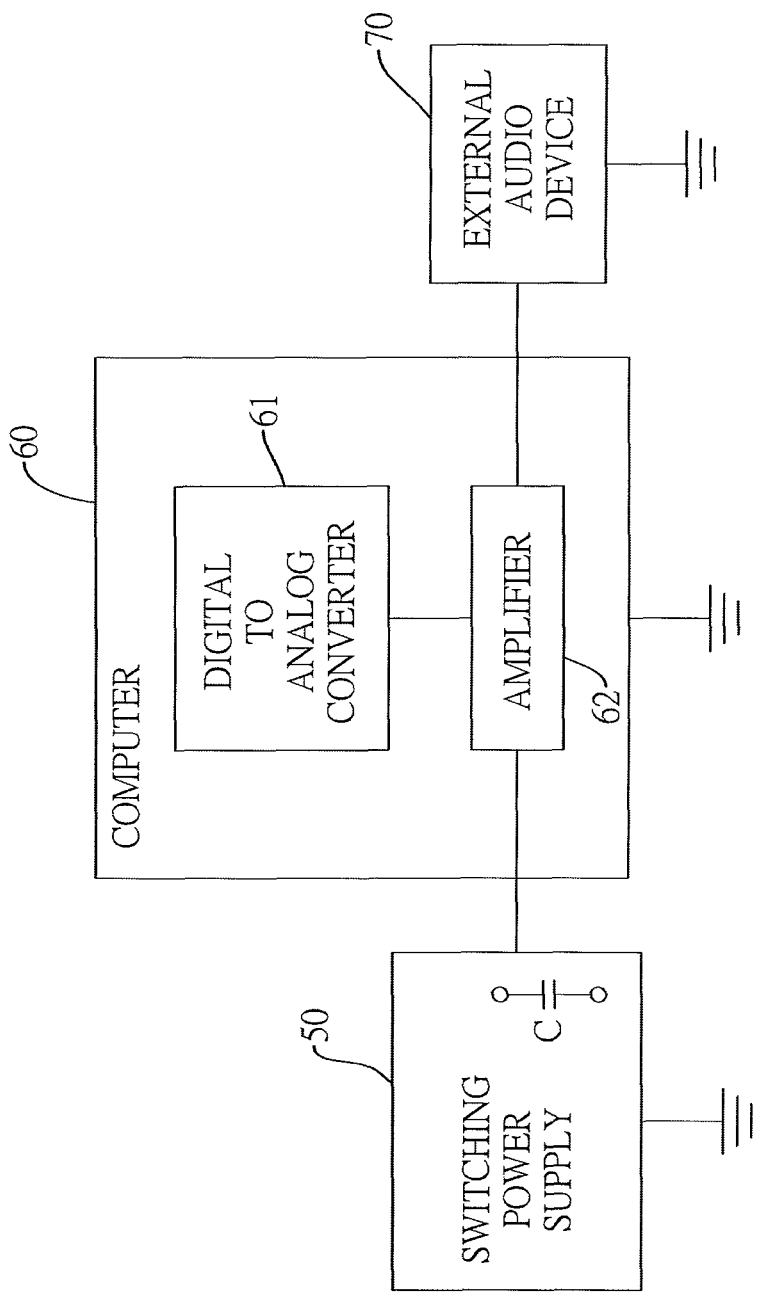
FIG. 11 is a block diagram of a computer adapted to a switching power supply.

With reference to FIG. 8, compared with the first embodiment of the impedance adjusting device 20 in accordance with the present invention, a fifth embodiment further comprises a second resistor 26, a zener diode 27, a first transistor 28, and a second transistor 29. The second resistor 26 is electronically connected between a cathode of the zener diode 27 and the power input port 21. An anode of the zener diode 27 is electronically connected with the second common terminals of the capacitors C1 to Cn. An emitter of the first transistor 28 is electronically connected with the power input port 21, a base of the first transistor 28 is electronically connected with the cathode of the zener diode 27, and a collector of the first transistor 28 is electronically connected with a base of the second transistor 29. An emitter of the second transistor 29 is electronically connected with the power input port 21, and a collector of the second transistor 29 is electronically connected with the power output port 22. The fifth embodiment can further stabilize an output voltage of the switching power supply 10. In the fifth embodiment, the first transistor 28 and the second transistor 29 are PNP type transistors.

The capacitors C1 to Cn, which are connected in parallel to the output capacitor of the switching power supply 10, can decrease the variation of the impedance of the switching power supply 10. Even when the frequencies of the audio signals are high frequency, the impedance of the switching power supply 10 can be stabilized at the predetermined impedance. Therefore, the audio signal can be played without distortions, and the user can enjoy the original audio signals.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An impedance adjusting device for connecting to a switching power supply including an output capacitor having a self-resonance, with the impedance adjusting device comprising:
   a power input port adapted to connect to the switching power supply;
   a ground terminal;
   a capacitor assembly including at least one assembly capacitor having a first common terminal and a second common terminal; wherein the first common terminal is electronically connected with the power input port, and wherein the second common terminal is electronically connected with the ground terminal; and
   a power output port electronically connected with the first common terminal of the at least one assembly capacitor;
   wherein the at least one assembly capacitor has an impedance related with frequency of the output capacitor of the switching power supply and is adapted to be connected in parallel to the output capacitor.

2. The impedance adjusting device as claimed in claim 1, wherein the at least one assembly capacitor comprises multiple capacitors connected in parallel; and
   wherein each of the multiple capacitors has the first common terminal electronically connected with the power input port and the second common terminal electronically connected with the ground terminal.

3. The impedance adjusting device as claimed in claim 1, further comprising an inductor electronically connected between the power input port and the power output port.

4. The impedance adjusting device as claimed in claim 1, further comprising a diode;
wherein an anode of the diode is electronically connected with the power input port, and a cathode of the diode is electronically connected with the power output port.

5. The impedance adjusting device as claimed in claim 1, further comprising a first resistor electronically connected between the power input port and the power output port.

6. The impedance adjusting device as claimed in claim 1, further comprising a second resistor, a zener diode, a first transistor, and a second transistor;
wherein:
the second resistor is electronically connected between a cathode of the zener diode and the power input port;
the zener diode has an anode electronically connected with the second common terminal of the at least one assembly capacitor;
the first transistor has an emitter electronically connected with the power input port, a base electronically connected with the cathode of the zener diode, and a collector electronically connected with a base of the second transistor; and
the second transistor has an emitter electronically connected with the power input port and a collector electronically connected with the power output port.

7. The impedance adjusting device as claimed in claim 6, wherein the first transistor and the second transistor are PNP type transistors.

8. The impedance adjusting device as claimed in claim 2, wherein a largest capacitance of the multiple capacitors is determined by a formula according to a predetermined attenuation value (db), a predetermined smallest frequency ($f_s$), an impedance ($R_{load}$) of a load, an input current ($I_{in}$) of the load, and an output current ($I_{out}$) of the load, $$db = 10 \times \log\left(\frac{I_{out}^2 \times R_{load}}{I_{in}^2 \times \left(R_{load} + \frac{1}{2\pi f_s C}\right)}\right).$$

9. The impedance adjusting device as claimed in claim 8, wherein capacitances of remaining of the multiple capacitors are determined by a method that the capacitance of a next capacitor ($C_{next}$) is determined by dividing the capacitance of a previous capacitor ($C_{previous}$) by a fixed number (N), $$C_{next} = \frac{C_{previous}}{N}.$$

10. The impedance adjusting device as claimed in claim 8, wherein a smallest capacitance of the multiple capacitors is determined by the formula whose predetermined smallest frequency ($f_s$) is replaced by a predetermined largest frequency ($f_l$), $$db = 10 \times \log\left(\frac{I_{out}^2 \times R_{load}}{I_{in}^2 \times \left(R_{load} + \frac{1}{2\pi f_l C}\right)}\right).$$

11. The impedance adjusting device as claimed in claim 2, further comprising an inductor electronically connected between the power input port and the power output port.

12. The impedance adjusting device as claimed in claim 2, further comprising a diode;
wherein an anode of the diode is electronically connected with the power input port, and a cathode of the diode is electronically connected with the power output port.

13. The impedance adjusting device as claimed in claim 2, further comprising a first resistor electronically connected between the power input port and the power output port.

14. The impedance adjusting device as claimed in claim 2, further comprising a second resistor, a zener diode, a first transistor, and a second transistor;
wherein:
the second resistor is electronically connected between a cathode of the zener diode and the power input port;
the zener diode has an anode electronically connected with the second common terminal of the at least one assembly capacitor;
the first transistor has an emitter electronically connected with the power input port, a base electronically connected with the cathode of the zener diode, and a collector electronically connected with a base of the second transistor; and
the second transistor has an emitter electronically connected with the power input port and a collector electronically connected with the power output port.

15. The impedance adjusting device as claimed in claim 14, wherein the first transistor and the second transistor are PNP type transistors.

* * * * *